(12) United States Patent
Sawai

(10) Patent No.: US 8,282,403 B2
(45) Date of Patent: Oct. 9, 2012

(54) CONNECTING UNIT

(75) Inventor: Mamoru Sawai, Makinohara (JP)

(73) Assignee: Yazaki Corporation, Tokyo (JP)

(*) Notice: Subject to any disclaimer, the term of this patent is extended or adjusted under 35 U.S.C. 154(b) by 0 days.

(21) Appl. No.: 13/146,682

(22) PCT Filed: Apr. 27, 2010

(86) PCT No.: PCT/JP2010/057843
§ 371 (c)(1),
(2), (4) Date: Jul. 28, 2011

(87) PCT Pub. No.: WO2010/126159
PCT Pub. Date: Nov. 4, 2010

(65) Prior Publication Data
US 2012/0009806 A1    Jan. 12, 2012

(30) Foreign Application Priority Data

Apr. 27, 2009 (JP) ................................. 2009-107727

(51) Int. Cl.
*H01R 12/00* (2006.01)
(52) U.S. Cl. ........................................................ 439/79
(58) Field of Classification Search ................... 439/79, 439/85, 62, 60, 487, 654, 638, 785; 174/520, 174/250, 254, 260, 117 F, 174 FF, 255; 29/845; 361/785
See application file for complete search history.

(56) References Cited

U.S. PATENT DOCUMENTS

| 5,223,676 | A  | * | 6/1993 | Yamamoto et al. | 174/250 |
| 5,419,708 | A  | * | 5/1995 | Koss et al. | 439/59 |
| 5,876,222 | A  | * | 3/1999 | Gardner et al. | 439/79 |
| 2006/0234530 | A1 | | 10/2006 | Chung | |
| 2006/0264112 | A1 | | 11/2006 | Nagahashi | |

FOREIGN PATENT DOCUMENTS

| JP | 07-074284 A | 3/1995 |
| JP | 2006-333583 A | 12/2006 |

OTHER PUBLICATIONS

Written Opinion, dated Oct. 6, 2010, issued in Application No. PCT/JP2010/057843 [PCT/ISA/237].
International Search Report, dated Oct. 6, 2010, issued in Application No. PCT/JP2010/057843 [PCT/ISA/210].

* cited by examiner

*Primary Examiner* — Edwin A. Leon
*Assistant Examiner* — Harshad Patel
(74) *Attorney, Agent, or Firm* — Sughrue Mion, PLLC

(57) ABSTRACT

A connecting unit includes a wiring board and a connector. The wiring board has a main face and a side face substantially perpendicular to the main face, and includes a soaking plate and a first terminal. The connector has a through hole for passing the first terminal therethrough. The first terminal is disposed in an intermediate layer of the wiring board and is projected outwardly from the side face. When the connector is connected to the wiring board, the first terminal passes through the through hole.

5 Claims, 7 Drawing Sheets

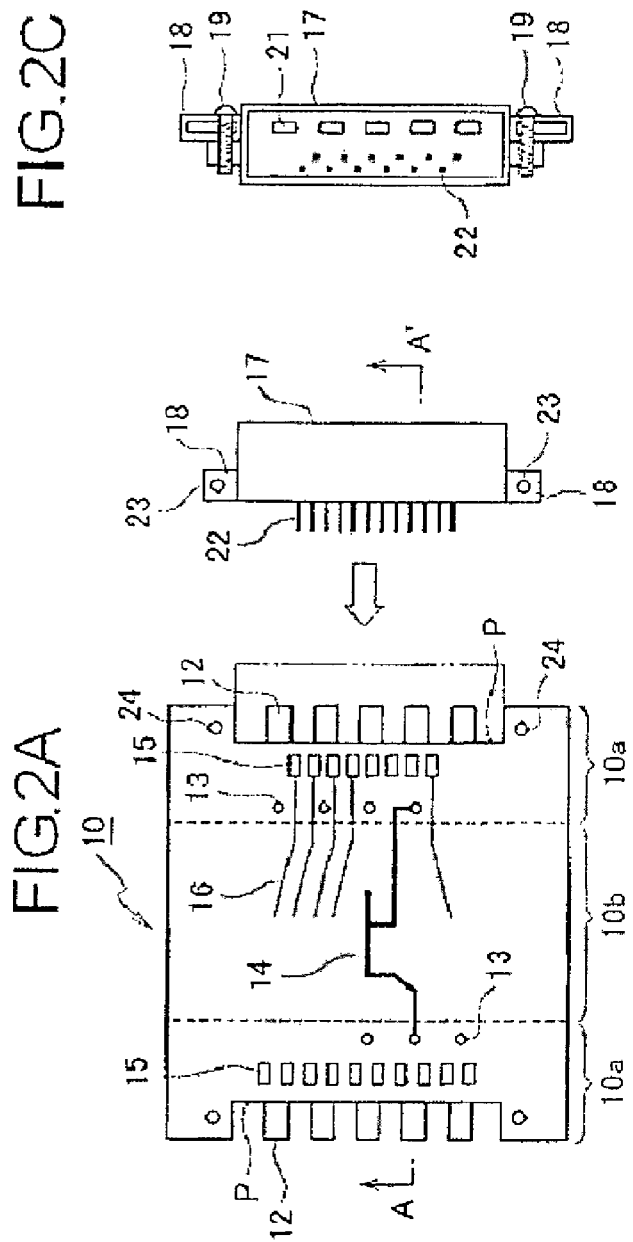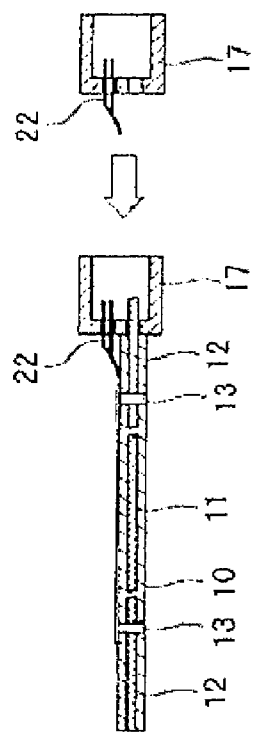

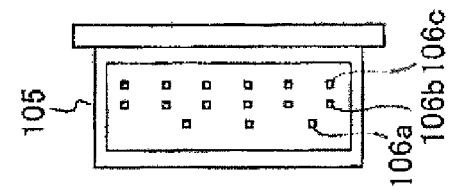
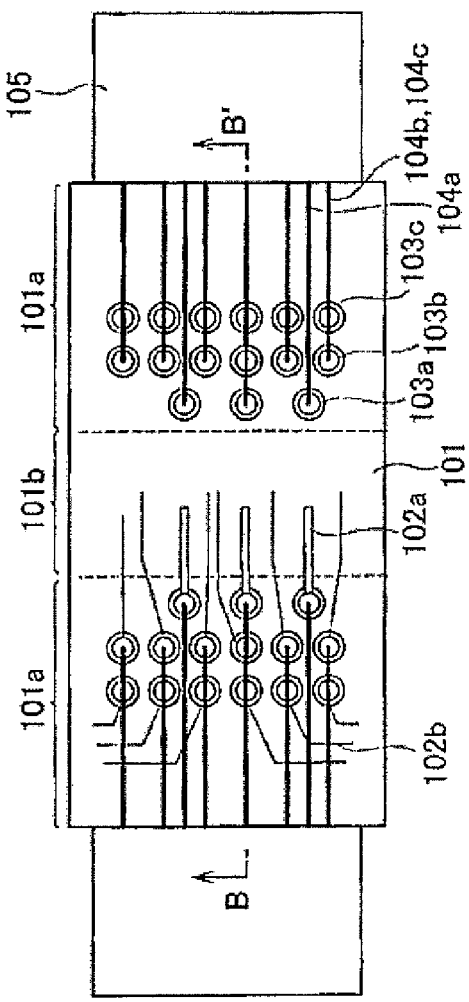
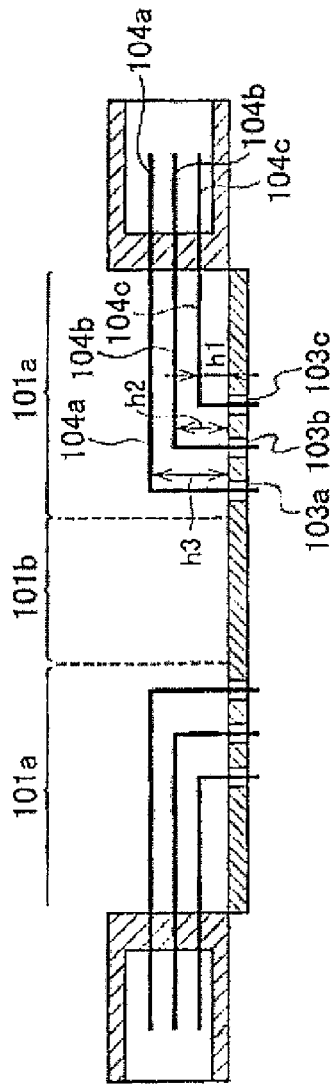

CONNECTING UNIT

TECHNICAL FIELD

This invention relates to a wiring board having a heat dissipation plate (metal plate), and more particularly to a connecting unit for connecting a connector to the wiring board.

BACKGROUND ART

With respect to wiring boards, for example, for mounting on a vehicle, there have been extensively used the type of wiring boards in which a connector is connected to a side edge portion of the wiring board, and the wiring board is connected to a wire harness through this connector (see, for example, PTL 1). FIG. 6 is a perspective view showing a connector connecting structure of a related wiring board, FIG. 7A is a plan view thereof, FIG. 7B is a front-elevational view thereof (a cross-sectional view taken along the line B-B'), and FIG. 7C is a side-elevational view thereof. As shown in FIG. 7A, a large-current circuit pattern 102a and a small-current circuit pattern 102b are formed on a face of the wiring board 101. In the wiring board 101, left and right areas (in the drawings) serve as terminal connecting areas 101a, respectively, and a central area serves as a parts-mounting area 101b.

A plurality of through holes 103 (103a to 103c) are formed through the terminal connecting area 101a, and are arranged in three rows. L-shaped terminals 104 (104a to 104c) are connected to the through holes 103, respectively. In this case, as shown in FIG. 7B, the L-shaped terminal 104c connected respectively to the through holes 103c disposed in the first row counting from an end of the wiring board are bent perpendicularly (that is, at right angles) at a height h1, and the L-shaped terminals 104b connected respectively to the through holes 103b disposed in the second row are bent perpendicularly at a height h2 (>h1), and the L-shaped terminals 104a connected respectively to the through holes 103a disposed in the third row are bent perpendicularly at a height h3 (>h2).

As shown in FIG. 7C, through holes 106 (106a to 106c) of a three-tier structure arranged in first, second and third tiers are formed through an end wall of a connector 105, and the L-shaped terminals 104a to 104c extend respectively through the corresponding through holes 106a to 106c and project into the interior of the connector 105. The connector 105 is fixed to the wiring board 101. Therefore, the wiring board can be connected to a wire harness (not shown), using the connector 105.

The through holes 103a disposed in the third row are used for a large-current circuit, and the large-current circuit patterns 102a are connected to these through holes 103a. The through holes 103c and 103b disposed in the first and second rows are used for a small-current circuit, and the small-current circuit pattern 102b is connected to the through holes 103c and 103b.

Electronic parts (not shown) of various kinds such as a relay and so on are mounted on the parts-mounting area 101b, and these electronic parts are connected to the corresponding through holes 103a to 103c via the circuit patterns 102a and 102b.

In this related wiring board 101, the terminal connecting areas 101a need to be provided adjacent respectively to the side edge portions thereof to which the connectors 105 are connected, respectively. Furthermore, in order that the L-shaped terminals 104 can be connected respectively to many through holes 103, the L-shaped terminals 104 (104a to 104c) of different heights (h1 to h3) are arranged at the terminal connecting area 101a, and therefore are densely disposed, and therefore a sufficient space for forming the circuit patterns 102 can not be secured at the terminal connecting area 101a.

CITATION LIST

Patent Literature
[PTL 1] JP-A-2006-333583

SUMMARY OF INVENTION

Technical Problem

As described above, in the related wiring board, the L-shaped terminals 104a to 104c of three different heights are connected respectively to the corresponding through holes 103a to 103c formed in the terminal connecting area 101a of the wiring board 101, and therefore a relatively-large space is required for the connection of the L-shaped terminals 104a to 104c, and therefore there has been encountered a problem that the sufficient parts-mounting area can not be secured.

This invention has been made in order to solve the above problem of the related structure, and an object of the invention is to provide a connector connecting structure of a wiring board in which a larger parts-mounting area can be secured.

In order to achieve the above object, according to the present invention, there is provided a connecting unit, comprising:

a wiring board that has a main face and a side face substantially perpendicular to the main face, and includes a heat dissipation plate and a first terminal; and a connector that has a through hole for passing the first terminal therethrough, wherein the first terminal is disposed in an intermediate layer of the wiring board and is projected outwardly from the side face; and wherein when the connector is connected to the wiring board, the first terminal passes through the through hole.

Preferably, a second terminal, having a flat plate shape, is provided on the main face of the wiring board, the connector includes an electric wire for connecting to the second terminal, and when the connector is connected to the wiring board, the electric wire is connected to the second terminal.

Preferably, the second terminal and other second terminals having flat plate shapes are provided on the main face along an extending direction of the side face, and the electric wire and other electric wires for connecting to the other second terminals are provided in the connector along a direction perpendicular to an passing though direction of the through hole, and are arranged so as to be staggered in a direction normal to the main face of the wiring board when the connector is connected to the wiring board.

Preferably, the wiring board has a large-current circuit and a small-current circuit, the first terminal is connected to the large-current circuit, and the electric wire for connecting to the second terminal is connected to the small-current circuit.

Preferably, both of the heat dissipation plate and the first terminal are disposed in the intermediate layer of the wiring board.

ADVANTAGEOUS EFFECTS OF INVENTION

By the above configuration, the connector is connected to the wiring board in such a manner that the projecting-type terminals disposed in the intermediate layer of the wiring board pass through the respective through holes formed in the connector. Therefore, the number of connecting wires connected at the face of the wiring board can be reduced, and the area of the wiring board at which the terminals are connected can be reduced. Therefore, the whole of the wiring board can be formed into a compact design, and therefore a space required for installing the wiring board can be reduced, and also the cost can be reduced.

By the above configuration, the connecting wire provided at the connector projects outwardly from the connector, and a distal end portion of this connecting wire is bent downwardly, and is connected to the flat plate-type terminal formed on the face of the wiring board, and a through hole is not used. With this construction, the area of the wiring board at which the terminals are connected can be further reduced.

By the above configuration, the plurality of connecting wires provided at the connector are alternately arranged (that is, arranged in a staggered manner) in the direction normal to the wiring board, and therefore the plurality of connecting wires can be connected to the flat plate-type terminals without overcrowding.

By the above configuration, the projecting-type terminals provided in the wiring board are used as the terminals for large-current circuit connecting purposes, and the connecting wire connected to the flat plate-type terminal is used as the terminal for small-current circuit connecting purposes. Therefore, the circuit patterns can be formed in the wiring board while easily separating the large-current circuit and the small-current circuit from each other.

By the above configuration, the heat dissipation plate and the projecting-type terminals are disposed in the same layer within the wiring board, and with this construction the soaking plate and the projecting-type terminals can be formed at the same step of the manufacturing process, and the time and labor required for the manufacture can be reduced.

BRIEF DESCRIPTION OF DRAWINGS

FIGS. 2A, 2B and 2C are a plan view, a front-elevational view (a cross-sectional view taken along the line A-A') and a side-elevational view of the connector connecting structure of the wiring board according to the embodiment of the invention, respectively.

FIGS. 7A, 7B and 7C are a plan view, a front-elevational view (a cross-sectional view taken along the line B-B') and a side-elevational view of the connector connecting structure of the related wiring board, respectively.

DESCRIPTION OF EMBODIMENTS

Figure 1:
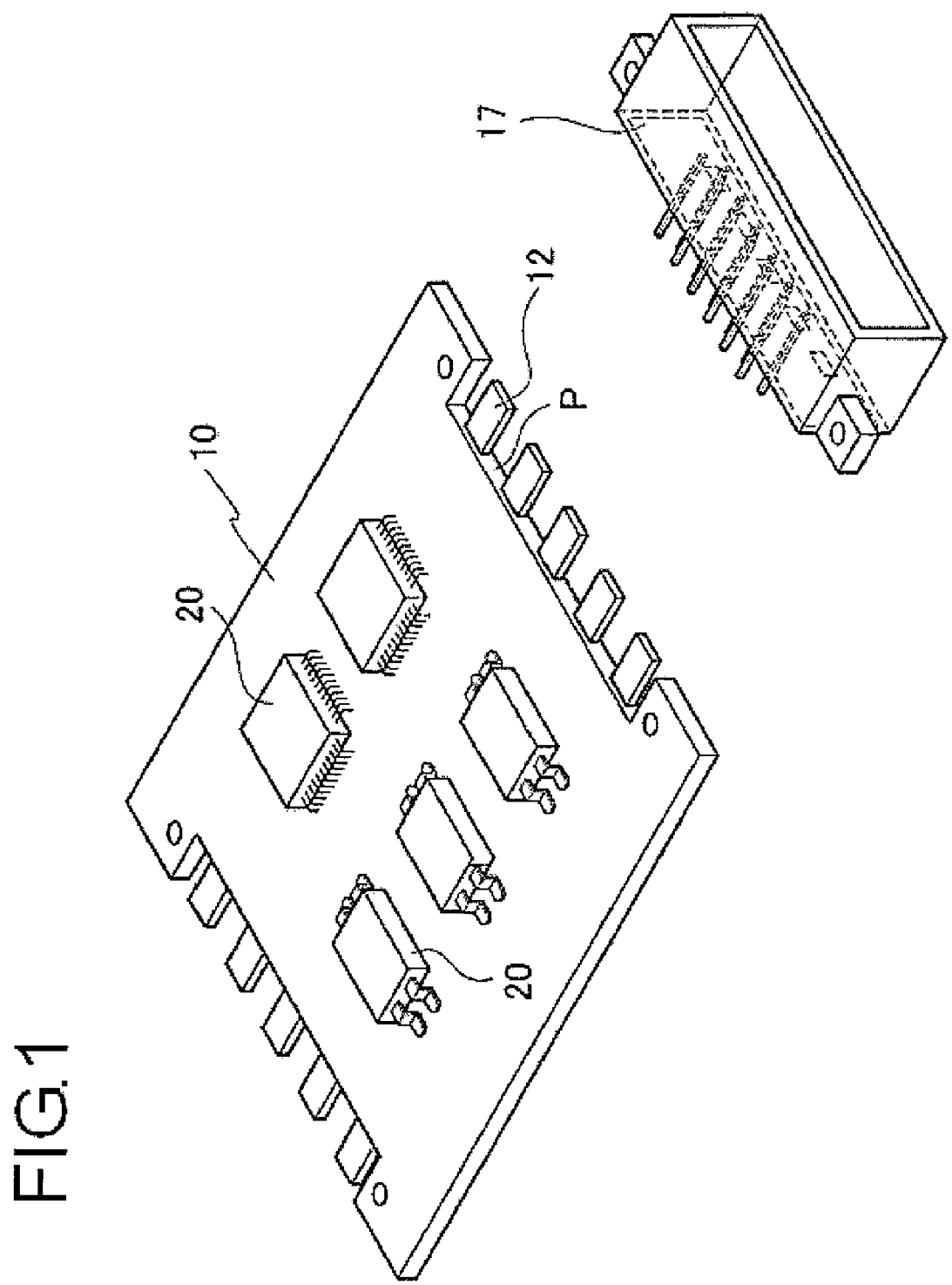
FIG. 1 is a perspective view showing a connector connecting structure of a wiring board according to an embodiment of the present invention.

A preferred embodiment of the present invention will now be described with reference to the drawings. FIG. 1 is a perspective view showing a connector connecting structure of a wiring board provided in accordance with one preferred embodiment of the invention, and FIGS. 2A, 2B and 2C are a plan view, a front-elevational view (a cross-sectional view taken along the line A-A') and a side-elevational view of the connector connecting structure of the wiring board, respectively.

As shown in the drawings, the wiring board 10 of this embodiment has a generally rectangular shape as a whole, and each of right and left ends (in the drawings) of the wiring board 10 is notched to form a recess, and an inner side (edge) of the notched portion (that is, a bottom of the recess) is formed as a side edge P of a straight shape. As shown in FIG. 1, electronic parts 20 of various kinds are mounted on a face of the wiring board 10.

As shown in FIG. 2A, right and left areas of the wiring board 10 serve as terminal connecting areas 10a, respectively, and a central area thereof serves as a parts-mounting area 10b. Each terminal connecting area 10a serves mainly as the area to which connector-connecting wires are connected, and the parts-mounting area serves as the area on which the electronic parts 20 of various kinds are mounted.

A heat dissipation plate (metal plate) 11 is provided in an inner layer of the wiring board 10 (see FIG. 2B), and further a plurality of projecting-type terminals 12 of a rectangular shape are provided in the same layer as the metal plate 11.

More specifically, five projecting-type terminals 12 (see FIG. 2A) are provided in each of the terminal connecting areas 10a, and are disposed at substantially equal intervals. The projecting-type terminals 12 are made of the same material as the metal plate 11. Part of each projecting-type terminal 12 projects outwardly from the side edge P of the wiring board. A through hole 13 is formed through at least one of the projecting-type terminals 12 (In the illustrated embodiment, a plurality of through holes 13 are formed through the corresponding projecting-type terminals 12, respectively.). The through holes 13 are connected to a circuit pattern 14 for large-current circuit-connecting purposes which is formed on the face of the wiring board 10. This circuit pattern 14 is connected to the electronic parts for a large-current circuit which are provided at the parts-mounting area 10b.

A plurality of pads (flat plate-type terminals) 15 are formed on each terminal connecting area 10a, and are disposed at substantially equal intervals along the side edge P. The pads 15 are connected to a circuit pattern 16 for small-current circuit-connecting purposes. The circuit pattern 16 is connected to the electronic parts for a small-current circuit which are provided at the parts-mounting area 10b.

A connector 17 substantially equal in length to the side edge P is attached to the side edge P, and the wiring board 10 is connected to a wire harness (not shown) via this connector 17.

A plurality of (five in the illustrated embodiment) through holes 21 of a rectangular shape are formed through an end wall of the connector 17 as shown in FIG. 2C, and a plurality of (twelve in the illustrated embodiment) metallic connecting wires 22 are provided at the connector 17. These connecting wires 22 project outwardly from a left (in the drawings) end face of the connector 17 as shown in FIG. 2A, and distal end portions of the metallic connecting wires 22 are bent downwardly as shown in FIG. 2B. The connecting wires 22 are arranged in a staggered manner as shown in FIG. 2C. Namely, the connecting wires 22 are staggered (that is, arranged alternately) in a direction normal to the wiring board 10. The distal end portions of the connecting wires 22 are connected to the corresponding pads 15 as described later.

A pair of brackets 18 each having a fixing hole 23 are formed at opposite side faces of the connector 17, respectively. The connector 17 is attached to the wiring board 10 in such a manner that the projecting-type terminals 12 provided at the wiring board 10 pass respectively through the through holes 21 formed in the connector 17. Further, the connector 17 is fixed to the wiring board 10 by screws 19 each passing through the corresponding fixing hole 23 in the bracket 18 and a corresponding fixing hole 24 formed through the wiring board 10. As a result, the projecting-type terminals 12 projecting through the respective through holes 21 into the interior of the connector 17 can be used as the terminals for connection to the wire harness (not shown) through the connector 17.

The projecting-type terminals 12 are connected via the respective through holes 13 to the large-current circuit-connecting circuit pattern 14 formed on the face of the wiring board 10. Therefore, the connection to the large-current circuit can be made, using the projecting-type terminals 12.

The distal end portions of the connecting wires 22 are arranged on the corresponding pads 15 in contacted relation thereto, and are fixed to the corresponding pads 15 by soldering. Therefore, the connecting wires 22 provided at the connector 17 can be used as terminals for connection to the wire harness through the connector 17. The pads 15 are connected to the small-current circuit-connecting circuit pattern 16, and therefore the connection to the small-current circuit can be made, using the pads 15.

Next, the procedure of manufacturing the above wiring board will be described with reference to FIGS. 3 to 5. First, a metallic plate 25 which is a material for forming the metal plate 11 and the projecting-type terminals 12 is processed or formed into a shape shown in FIG. 3 by etching or a pressing process. More specifically, the heat dissipation plate (metal plate) 11 of a generally H-shape and five projecting-type terminals 12 of a rectangular shape disposed at each of right and left sides of the metal plate 11 are formed. In the example shown in FIG. 3, although the projecting-type terminals 12 are severed from the metal plate, 11, at least one of the projecting-type terminals 12 can be integrally connected with the metal plate 11 as described later according to a required use.

Figure 4:
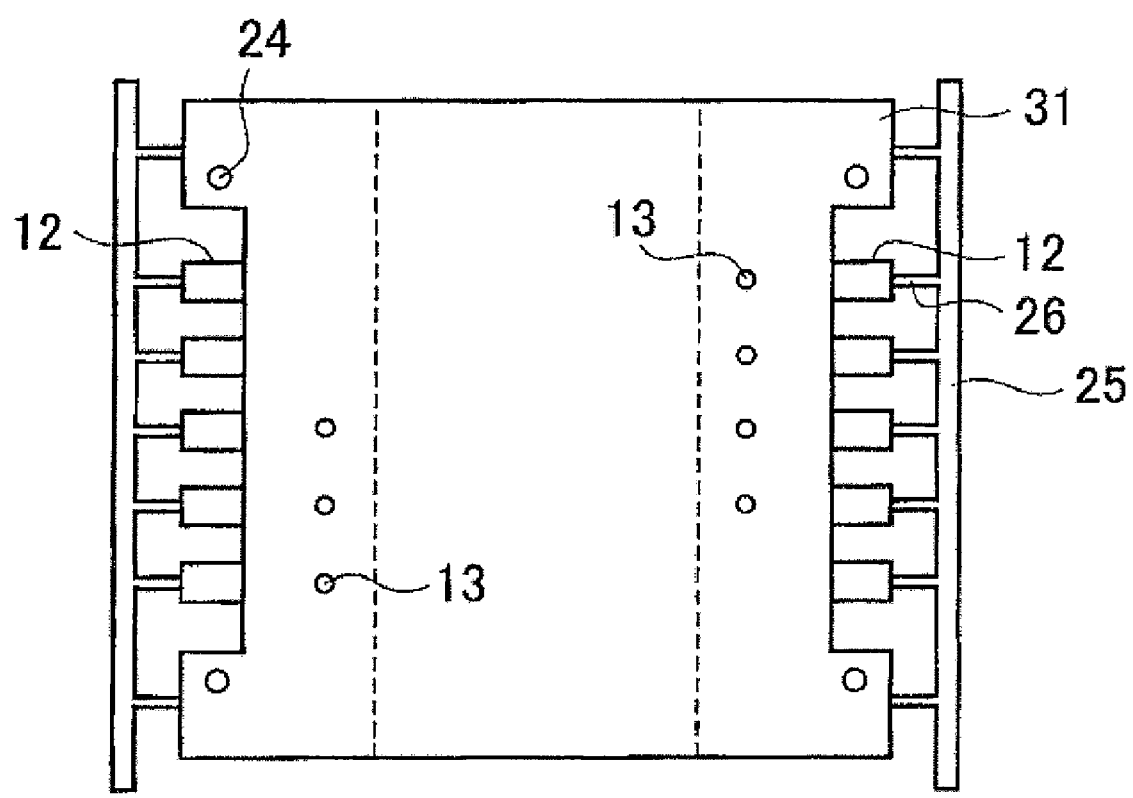
FIG. 4 is an explanatory view showing the process of providing a prepreg in the connector connecting structure of the wiring board according to the embodiment of the invention.
Figure 5:
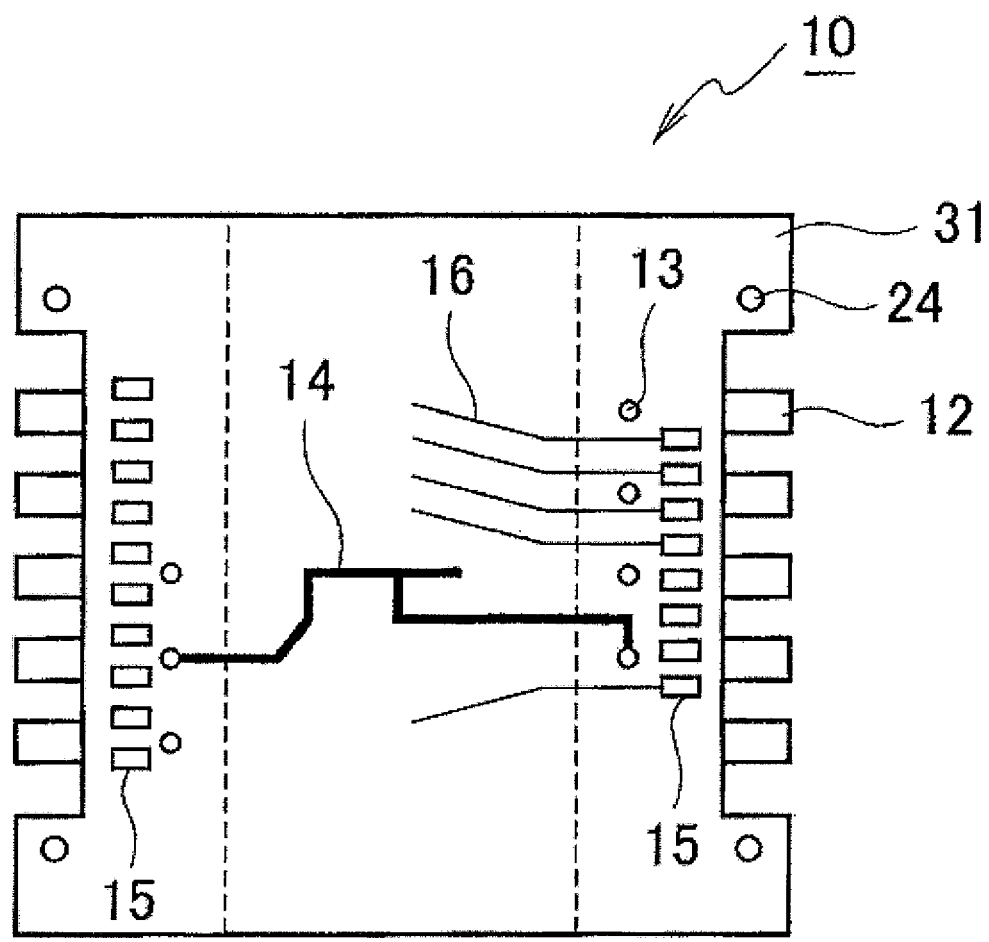
FIG. 5 is an explanatory view showing the process of forming circuit patterns in the connector connecting structure of the wiring board according to the embodiment of the invention.
Figure 6:
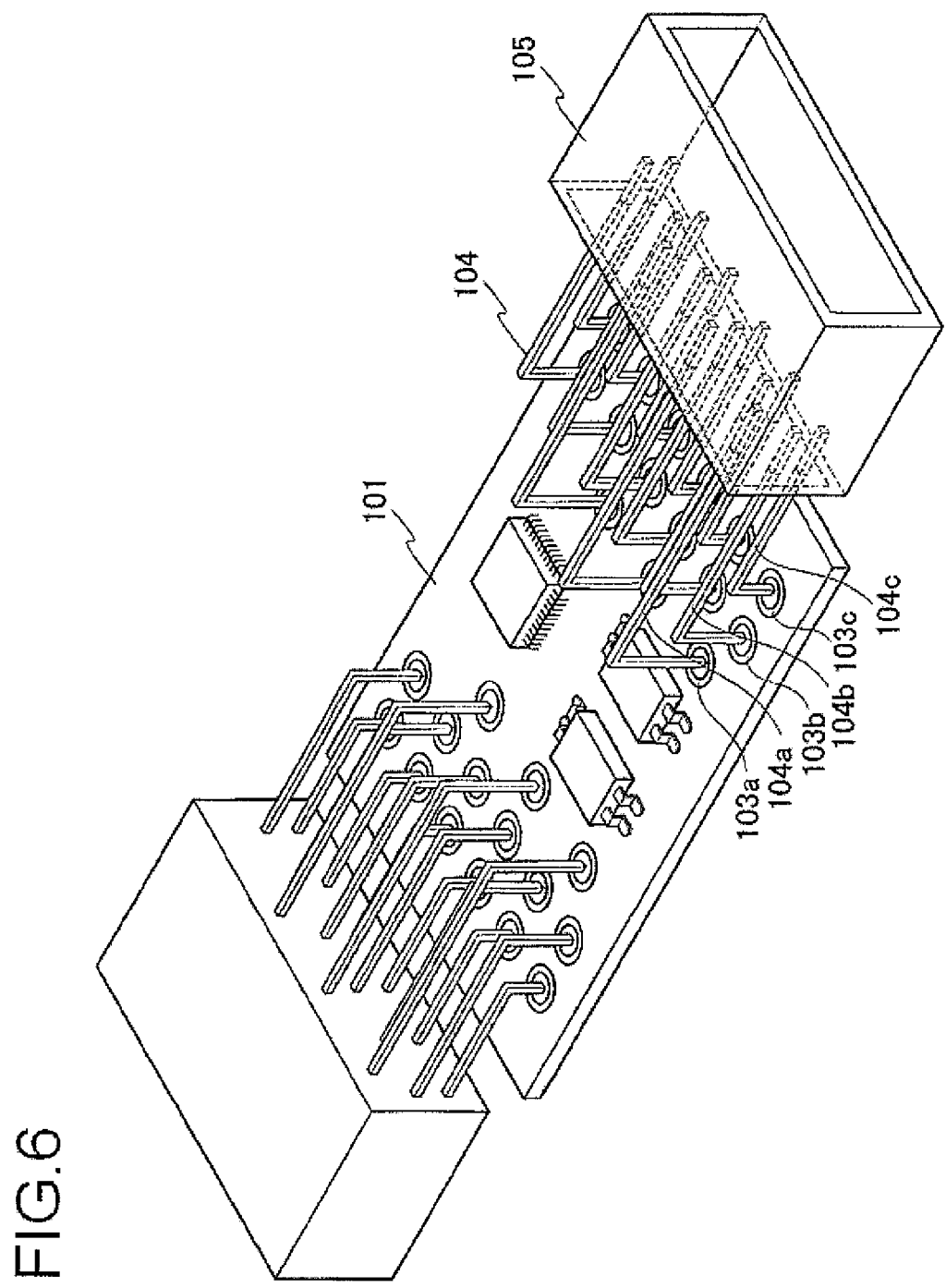
FIG. 6 is a perspective view showing a connector connecting structure of a related wiring board.

Then, as shown in FIG. 4, a prepreg 31 having a metallic foil is laminated on one side (face) of the metallic plate 25, or prepregs 31 are laminated on both sides (faces) of the metallic plate 25, respectively. Then, the prepreg 31 is hot pressed, thereby forming an outer shape of the wiring board 10. Further, the through holes 13 and the fixing holes 24 are formed, and thereafter ribs 26 extending from the metal plate 11 and the projecting-type terminals 12 are cut off by pressing, a rooter or other means.

Then, masking is applied to a surface of the prepreg 31 so as to form the circuit patterns, and etching is applied to the surface of the prepreg 31, thereby forming the desired circuit. As a result, the wiring board 10 having the circuit patterns 14 and 16, the through holes 13 and the pads 15 is formed as shown in FIG. 5.

As described above, in the connector connecting structure of the wiring board of this embodiment, the connector 17 is connected to the wiring board 10 so that the projecting-type terminals 21 provided in the intermediate layer of the wiring board 10 and partially projecting outwardly therefrom pass through the respective through holes 21 formed in the connector 17. Therefore, it is not necessary that large-current circuit connecting wires (corresponding to the L-shaped terminals 104a shown in FIGS. 7A and 7B) be connected to the large-current circuit-connecting circuit pattern at the face of the wiring board 10 as in the related structure. Therefore, a space required for the connection of the large-current circuit connecting wires can be saved, and the terminal connecting area 10a can be made small.

Furthermore, the distal end portions of the connecting wires 22 projecting from the end face of the connector 17 are bent downwardly and are contacted with the pads 15, and are connected thereto by soldering. Therefore, it is not necessary to use through holes (through holes 103a to 103c in FIGS. 7A and 7B) as in the related structure, and therefore the terminal connecting area 10a can be further reduced.

Therefore, the parts-mounting area 10b can be relatively made large, and a larger number of electronic parts can be mounted on the wiring board 10. Furthermore, in the case where the electronic parts to be mounted on the wiring board are the same parts, the whole of the wiring board 10 can be formed into a compact design, and in the case where the wiring board 10 is to be received within an electric connection box (not shown), the whole of the electric connection box can be formed into a compact and low-cost design.

Furthermore, the connecting wires 22 mounted on the connector 17 are arranged in a staggered manner as shown in FIG. 2C, and therefore even when the number of the connecting wires 22 increases, the distal end portions of the connecting wires 22 can be orderly connected to the corresponding pads 15 without overcrowding.

Figure 3:
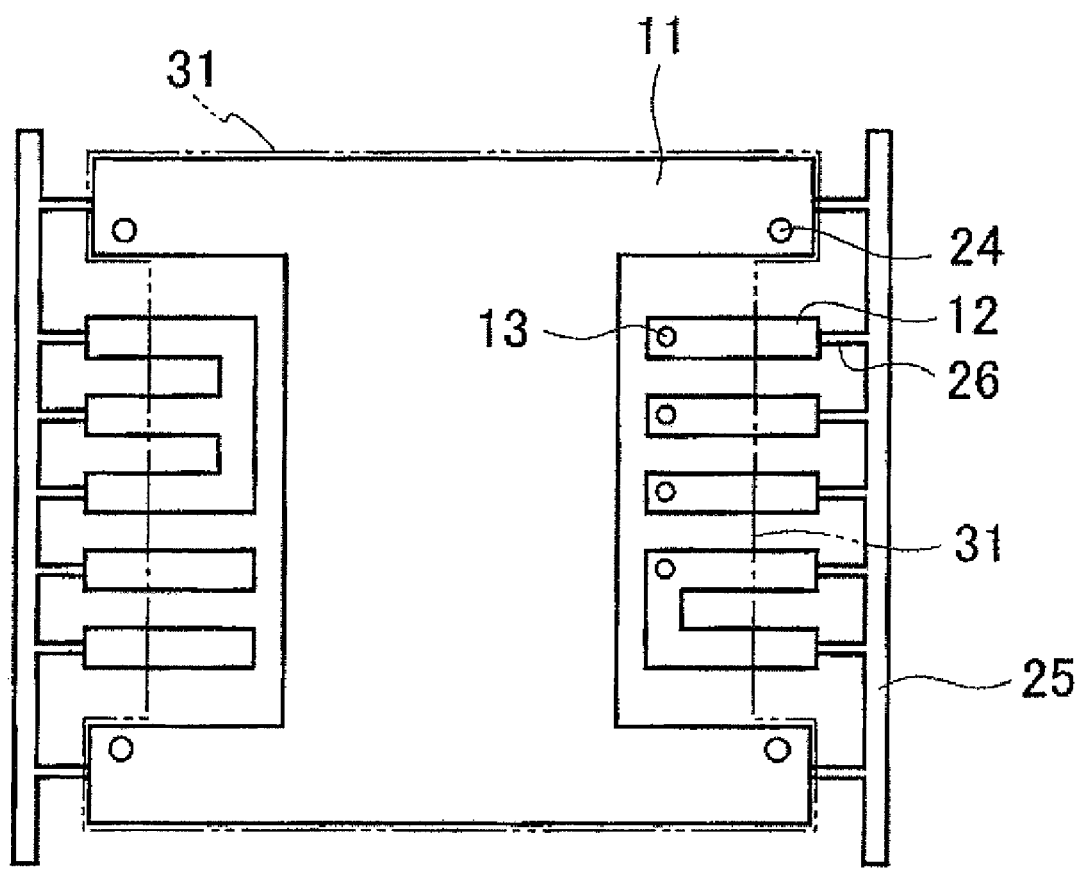
FIG. 3 is an explanatory view showing the step of forming a metal plate and projecting-type terminals in the connector connecting structure of the wiring board of the invention.

Furthermore, the metal plate 11 and the projecting-type terminals 12 are provided in the same layer within the wiring board 10, and are formed from the common metallic plate 25 as shown in FIG. 3. Therefore, the metal plate 11 and the projecting-type terminals 12 can be formed at the same step of the manufacturing process, and thus a separate step of forming the projecting-type terminals 12 is not necessary, and therefore the time and labor required for the manufacturing process can be reduced.

Furthermore, the projecting-type terminals 12 are connected to the large-current circuit, while the pads 15 are connected to the small-current circuit, and with this construction the large-current electronic parts and the small-current electronic parts can be mounted on the wiring board 10, and also these electronic parts can be easily installed on the circuit pattern.

Although the connector connecting structure of the wiring board of the present invention has been described with reference to the illustrated embodiment, the invention is not limited to this embodiment, and the constructions of the various portions can be replaced with suitable constructions having similar functions.

For example, in the above embodiment, the projecting-type terminals 12 are separated from the metal plate 11, and the metal plate 11 is used for thermal diffusion purposes, and the projecting-type terminals 12 are used as the large-current circuit-connecting terminals. However, the metal plate 11 can be connected to at least one of the projecting-type terminals 12 so that the metal plate 11 can be used as an electrode.

Although the invention has been illustrated and described for the particular preferred embodiments, it is apparent to a person skilled in the art that various changes and modifications can be made on the basis of the teachings of the invention. It is apparent that such changes and modifications are within the spirit, scope, and intention of the invention as defined by the appended claims.

The present application is based on Japanese Patent Application No. 2009-107727 filed on Apr. 27, 2009, the contents of which are incorporated herein by reference.

Industrial Applicability

The present invention is extremely useful in forming the wiring board with the metal plate into a compact design.

Reference Signs List

P side edge
10 wiring board
10a terminal connecting area
10b parts-mounting area
11 heat dissipation plate (metal plate)
12 projecting-type terminal
13 through hole
14 circuit pattern (for large-current circuit connecting purposes)
15 pad
16 circuit pattern (for small-current circuit connecting purposes)
17 connector
18 bracket
19 screw
20 electronic parts
21 through hole
22 connecting wire
23, 24 fixing hole
25 metallic plate
26 ribs
31 prepreg
101a terminal connecting area
101b parts-mounting area
102a, 102b circuit pattern
103a to 103c through hole
104a to 104c L-shaped terminal
105 connector
106a to 106c through hole

The invention claimed is:

1. A connecting unit, comprising:
    a wiring board that has a main face and a side face substantially perpendicular to the main face, and includes a heat dissipation plate and a first terminal; and
    a connector that has a through hole for passing the first terminal therethrough,
        wherein the first terminal is disposed in an intermediate layer of the wiring board and is projected outwardly from the side face; and
    wherein when the connector is connected to the wiring board, the first terminal passes through the through hole.

2. The connecting unit according to claim 1, wherein a second terminal, having a flat plate shape, is provided on the main face of the wiring board; wherein the connector includes an electric wire for connecting to the second terminal; and
    wherein when the connector is connected to the wiring board, the electric wire is connected to the second terminal.

3. The connecting unit according to claim 2, wherein the second terminal and other second terminals having flat plate shapes are provided on the main face along an extending direction of the side face; and
    wherein the electric wire and other electric wires for connecting to the other second terminals are provided in the connector along a direction perpendicular to an passing though direction of the through hole, and are arranged so as to be staggered in a direction normal to the main face of the wiring board when the connector is connected to the wiring board.

4. The connecting unit according to claim 2, wherein the wiring board has a large-current circuit and a small-current circuit; and
    wherein the first terminal is connected to the large-current circuit, and the electric wire for connecting to the second terminal is connected to the small-current circuit.

5. The connecting unit according to claim 1, wherein both of the heat dissipation plate and the first terminal are disposed in the intermediate layer of the wiring board.

* * * * *